(12) United States Patent
Lien et al.

(10) Patent No.: US 7,706,113 B1
(45) Date of Patent: Apr. 27, 2010

(54) ELECTRICAL OVERSTRESS (EOS) AND ELECTROSTATIC DISCHARGE (ESD) PROTECTION CIRCUIT AND METHOD OF USE

(75) Inventors: Chuen-Der Lien, Los Altos Hills, CA (US); Ta-Ke Tien, Cupertino, CA (US)

(73) Assignee: Integrated Device Technology, Inc., San Jose, CA (US)

( * ) Notice: Subject to any disclaimer, the term of this patent is extended or adjusted under 35 U.S.C. 154(b) by 562 days.

(21) Appl. No.: 11/668,360

(22) Filed: Jan. 29, 2007

(51) Int. Cl.
*H02H 9/00* (2006.01)
*H02H 3/22* (2006.01)

(52) U.S. Cl. ........................... 361/56; 361/111
(58) Field of Classification Search .................. 361/56, 361/111
See application file for complete search history.

(56) References Cited

U.S. PATENT DOCUMENTS

| | | | | |
|---|---|---|---|---|
| 4,751,410 A | * | 6/1988 | Tanizawa | 326/32 |
| 5,381,059 A | * | 1/1995 | Douglas | 326/58 |
| 5,559,659 A | | 9/1996 | Strauss | |
| 5,726,589 A | * | 3/1998 | Cahill et al. | 326/81 |
| 5,946,177 A | * | 8/1999 | Miller et al. | 361/56 |
| 6,552,886 B1 | | 4/2003 | Wu | |
| 2007/0066266 A1 | * | 3/2007 | Muraoka | 455/307 |

* cited by examiner

*Primary Examiner*—Stephen W Jackson
*Assistant Examiner*—Zeev Kitov
(74) *Attorney, Agent, or Firm*—Molly Sauter; Kenneth Glass; Glass & Associates

(57) ABSTRACT

A system and method are provided for electrostatic discharge (ESD) protection circuit having overshoot and undershoot voltage protection during a power supply ramp-up of the circuit. In a specific embodiment, the ESD protection circuit of the present invention includes an ESD discharge circuit coupled between a power supply node and a ground supply node, a trigger circuit coupled to the ESD discharge circuit, the trigger circuit to turn the ESD discharge circuit on in the presence of a voltage spike during the power supply ramp-up and to turn the ESD discharge circuit off in the absence of a voltage spike during the power supply ramp-up, and a delay circuit coupled between the discharge circuit and the trigger circuit, the delay circuit to slow down the turn-off of the discharge circuit to prevent an overshoot or undershoot voltage condition during the power supply ramp-up of the circuit.

20 Claims, 4 Drawing Sheets

ELECTRICAL OVERSTRESS (EOS) AND ELECTROSTATIC DISCHARGE (ESD) PROTECTION CIRCUIT AND METHOD OF USE

BACKGROUND OF THE INVENTION

With advances in technology and the miniaturization of device elements in semiconductor integrated circuits, integrated circuits are becoming more susceptible to damage due to electrostatic discharge (ESD). In many applications, device elements have reached the submicron level in size, and correspondingly, MOS gate oxide films have become increasingly thin. As a result, the internal circuitry of an integrated circuit device is easily damaged by an ESD event. As semiconductors continue to shrink in size and become increasingly more complex, significant Electrical Overstress (EOS) and Electrostatic Discharge (ESD) become a greater challenge for both designers and manufacturers.

Electrical overstress (EOS) is a thermal overstress event that is introduced when a product is exposed to a current or voltage beyond its maximum rating, usually from power supplies or test equipment. The duration of EOS events ranges from milliseconds to seconds (typical >50 μsec). An EOS failure is typically catastrophic and causes permanent, irreparable damage to the integrated circuit device. An ESD event is a transfer of electrostatic charge between bodies or surfaces at different electrostatic potentials, either through direct contact or through induced electrical fields. ESD is considered to be a subset of EOS and is usually caused by static electricity. The duration of ESD events ranges from nanoseconds to microseconds.

Protection circuits are known in the art for protecting the circuitry of an integrated circuit from EOS and ESD event damage. It is known in the art to employ an active clamp with an R-C sense for ESD protection. With this system, an R-C sensing element formed by a capacitor and a resistor is used to sense the ESD pulse and actively drive the gate of a clamping transistor through an inverter. With the clamping transistor turned on, the excess voltage is shunted to ground and the core circuitry is protected from the ESD pulse. The clamping transistor will remain conductive for a period of time which is determined by the RC time constant of the trigger circuit. As a result, this RC time constant should be set long enough to exceed the maximum expected duration of an ESD event, typically three to five hundred nanoseconds, while short enough to avoid false triggering of the clamp circuit during normal ramp-up of the VDD power rail. This VDD ramp-up during normal operation typically requires two to five milliseconds. Note that once VDD reaches a constant power supply level, the circuit is biased in a nonconductive state as required for normal operation. It is also known in the art to replace the resistor in the R-C sensing element with a transistor, such as a grounded-gate p-channel transistor.

While such an active ESD-protection circuit is useful, it may be susceptible to noise, especially during power-up of the chip. If the active ESD-protection circuit triggers during power-up, the quick turn off of the ESD clamping device may cause a power bus overshoot or undershoot. The stress on the circuitry results from this overshoot or undershoot voltage can damage the ESD-protection circuit during power-up and cause power shorting through the damaged device.

In light of the above, a need exists in the art for an active ESD-protection circuit that prevents an overshoot or undershoot condition when the ESD-protection circuit is unintentionally triggered during power-up of the integrated circuit.

SUMMARY OF THE INVENTION

In accordance with the present invention, a system and method are provided to reduce the power line overshoot or undershoot during power-up. The present invention employs circuitry to establish a slow down path which delays the turn off of the ESD device.

In accordance with an embodiment of the present invention, an electrostatic discharge (ESD) protection circuit is provided having overshoot and undershoot voltage protection during a power supply ramp-up of the circuit, the circuit includes an ESD discharge circuit coupled between a power supply node and a ground supply node, a trigger circuit coupled to the ESD discharge circuit and a delay circuit coupled between the discharge circuit and the trigger circuit. The trigger circuit in accordance with the present invention turns the ESD discharge circuit on in the presence of a voltage spike during the power supply ramp-up and turns the ESD discharge circuit off in the absence of a voltage spike during the power supply ramp-up. The delay element in accordance with the present invention is effective in slowing down the turn-off of the discharge circuit to prevent an overshoot or undershoot voltage condition during the power supply ramp-up of the circuit.

In a particular embodiment, the discharge circuit in accordance with the present invention is a MOSFET transistor. In this embodiment, the gate of the MOSFET transistor is coupled to the delay element. The MOSFET transistor may be either a p-type or an n-type transistor.

The trigger circuit in accordance with the present invention drives the discharge circuit and turns the discharge circuit on when an ESD event occurs. The trigger circuit may be an RC trigger circuit or a voltage level sensing trigger circuit, both of which are known in the art in ESD protection circuits. The trigger circuit may additionally include a drive circuit to actively drive the discharge circuit. In a specific embodiment, the drive circuit may further include a CMOS inverter.

The delay circuit in accordance with the present invention is effective in slowing down the turn-off of the discharge circuit to prevent an overshoot or undershoot condition. In a particular embodiment, the delay circuit includes an inverter having a pull-up transistor and a pull-down transistor and a resistive element positioned between an output of the inverter and a drain node of the pull-down transistor. More specifically, the pull-up transistor of the delay circuit has a gate node coupled to the trigger circuit, a source node coupled to the power supply and a drain node coupled to the discharge circuit. The pull-down transistor of the delay circuit has a gate node coupled to the trigger circuit and a source node coupled to a ground node and the resistive element is then coupled between the discharge circuit and a drain node of the pull-down transistor.

In a particular embodiment, the pull-up transistor is a PMOS transistor, the pull-down transistor is an NMOS transistor and the resistive element is a resistor. In an alternate embodiment a transistor can be used as the resistive element.

In an integrated circuit that includes more than one ESD protection circuit, a plurality of ESD protection circuits may be used within the integrated circuit device. In accordance with this embodiment, the trigger circuit for each of the plurality of ESD protection circuits further includes a turn-off delay circuit to delay the turn-off signal to the delay circuit for each of the plurality of ESD protection circuits during the power supply ramp-up.

In a specific embodiment, the turn-off delay circuit includes at least one inverter and at least one NOR gate coupled between a triggering input to the turn-off signal delay stage circuit and the delay circuit. The combination of the inverters and the NOR gates is effective in delaying the transmission of the turn-off signal to the delay circuit but does not delay the transmission of the turn-on signal to the delay circuit. In addition, the number of inverters and NOR gates may be varied for each of the individual ESD protection circuits such that the delay time may be different for each of the plurality of ESD circuits and as such, the turn-off signal transmission for each of the plurality of ESD circuits will be staggered, each contributing to the total turn-off delay of the ESD protection circuit. As such, the total turn-off current is more precisely controlled and the overshoot voltage is further reduced when using multiple ESD protection circuits within an integrated circuit device.

In accordance with the present invention, a method for preventing damage to an electrostatic discharge (ESD) protection circuit when a discharge circuit of the ESD circuit is unintentionally turned-on during power-up of the ESD protection circuit is provided. The method of the present invention results in a delayed turn-off of the discharge circuit to prevent an overshoot or undershoot voltage condition thereby preventing damage to the ESD protection circuit. The unintentional turn-on of the discharge circuit may be a result of noise on the power supply bus that is coupled to the ESD protection circuit.

The present invention is applicable to a variety of ESD circuitry, including but not limited to RC triggering and level sensing triggering ESD circuits.

As such, the present invention provides an improved active ESD-protection circuit that prevents an overshoot or undershoot condition when the ESD-protection circuit is unintentionally triggered during power-up of the integrated circuit.

BRIEF DESCRIPTION OF THE DRAWINGS

For a fuller understanding of the invention, reference should be made to the following detailed description, taken in connection with the accompanying drawings, in which.

DETAILED DESCRIPTION OF THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

Figure 1:
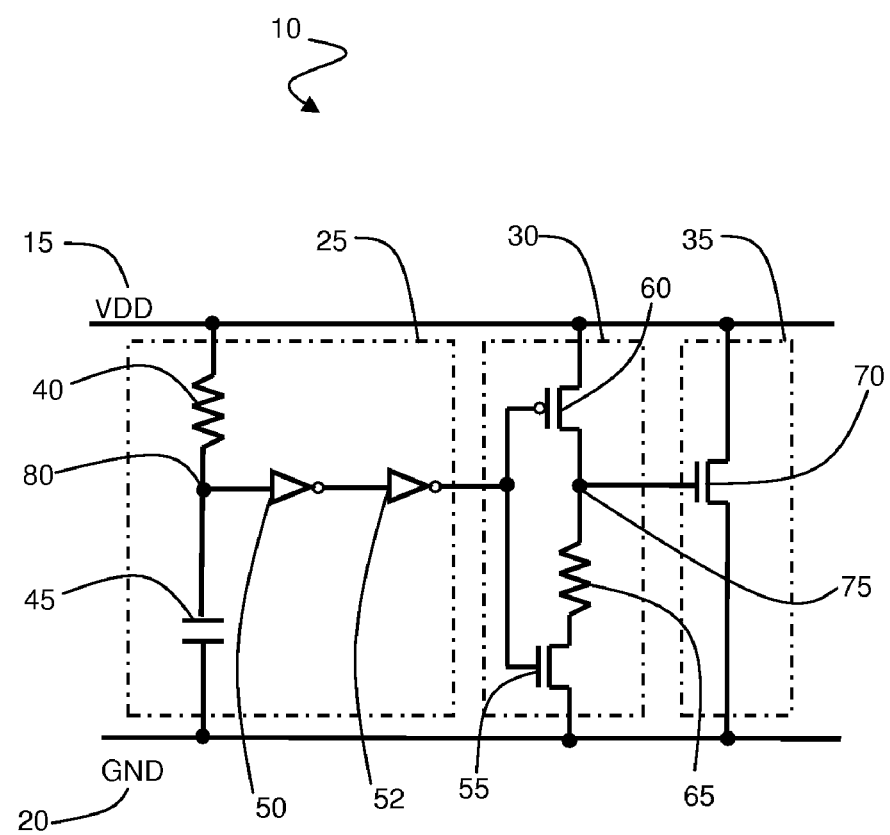
FIG. 1 is a diagrammatic view of an ESD protection circuit in accordance with an embodiment of the present invention employing an RC trigger.

With reference to FIG. 1, an ESD protection circuit 10 in accordance with an embodiment of the present invention having overshoot and undershoot voltage protection during a power supply ramp-up of the circuit is illustrated. The circuit includes an ESD discharge circuit 35 coupled between a power supply node 15 and a ground supply node 20, a trigger circuit 25 coupled to the ESD discharge circuit 35 and a delay circuit 30 coupled between the ESD discharge circuit 35 and the trigger circuit 25. The trigger circuit 25 in accordance with the present invention turns the ESD discharge circuit 35 on in the presence of a voltage spike during the power supply 15 ramp-up and turns the ESD discharge circuit 35 off in the absence of a voltage spike during the power supply 15 ramp-up. The delay circuit 30 in accordance with the present invention is effective in slowing down the turn-off of the ESD discharge circuit 35 to prevent an overshoot or undershoot voltage condition during the power supply 15 ramp-up of the circuit.

In a particular embodiment, the ESD discharge circuit 35 in accordance with the present invention is a MOSFET transistor 70. In this embodiment, the gate 75 of the MOSFET transistor 70 is coupled to the delay element 30. In this embodiment, the MOSFET transistor 70 is shown as an n-type transistor, however, it is within the scope of the present invention to use either a p-type or an n-type transistor.

The trigger circuit 25 in accordance with the present invention drives the ESD discharge circuit 35 and turns the ESD discharge circuit 35 on when an ESD event occurs. With reference to FIG. 1, in a particular embodiment the trigger circuit 25 is an RC trigger circuit. In an RC trigger circuit, a resistor 40 and a capacitor 45 are positioned in series between the power 15 and ground 20. During normal powered operation, the top plate of the capacitor 45 is charged to VDD through resistor 40 from the power supply 15. The high voltage level at node 80 is transmitted through the inverters of the drive circuit resulting in a high voltage level at the gate of transistor 60 and transistor 55 causing the gate of n-channel discharge transistor 70 to be driven low. As such, the n-channel discharge transistor 70 is turned off, allowing power supply 15 to remain at VDD to power the internal circuits.

When an ESD event occurs, a sudden pulse is applied to power supply node 15. The rapid rise in voltage at node 80 causes the source of the p-channel transistor 60 to rise quickly. However, the gate of p-channel transistor 60 does not rise as quickly because of the RC time constant delay caused by the charging of the capacitor 45 through the resistor 40. The gate-to-source voltage differential across the p-channel transistor 60 causes the transistor 60 to turn on, which causes the gate of the discharge transistor 70 to be pulled high which turns on the discharge transistor 70 so that the discharge transistor 70 can shunt the ESD current from the power supply 15 to ground 20, thereby protecting the circuit from ESD damage. The duration of an ESD event is short and as such, a quick turn-off of the discharge transistor 70 after and ESD event does not cause an overshoot or undershoot condition because the excess current from the ESD event has been discharged to ground before the turn-off of the discharge transistor 70 is initiated by the trigger circuit.

During power-up of the device, noise on the power supply 15 may unintentionally trigger the ESD circuit and cause the discharge transistor 70 to turn-on. Under ideal power-up conditions, the discharge transistor 70 does not conduct because the VDD voltage rises relatively more slowly with respect to the GND voltage than the RC time constant set by the resistor 40 capacitor 45 combination. As such, under ideal power-up conditions, the resistor 40 can charge node 80 to VDD, thereby preventing conduction of the discharge transistor 70. However, a noise spike on VDD during power-up can cause the discharge transistor 70 to turn on and begin conducting. The discharge transistor 70 then turns off quickly during power-up, resulting in a power bus overshoot or undershoot condition. The stress caused by the power bus overshoot or undershoot can damage the ESD protection circuit during power-up and cause power shorting through the damaged device.

The overshoot voltage can be expressed mathematically as: $dV=L*dI/dt$, where $dI/dt$ is the time rate of change of the inductor current, dV is the differential voltage across the inductor between GND and VCC, and L is the package inductance of the CMOS device. As such, by slowing down the time rate of change of the inductor current (dI/dt) during the ESD turn off, the overshoot voltage can be reduced. The delay circuit 30 in accordance with the present invention is effective in slowing down the turn-off of the discharge circuit to prevent an overshoot or undershoot condition on the power bus. With reference again to FIG. 1, in a particular embodiment, the delay circuit 30 includes an inverter having a pull-up transistor 60 and a pull-down transistor 55 and a resistive element 65. The pull-up transistor 60 of the delay circuit 30 has a gate node coupled to the trigger circuit 25, a source node coupled to the power supply 15 and a drain node coupled to the ESD discharge circuit 35. The pull-down transistor 55 of the delay circuit 30 has a gate node coupled to the trigger circuit 25 and a source node coupled to a ground node 20 and the resistive element 65 is then coupled between the ESD discharge circuit 35 and a drain node of the pull-down transistor 55. With this configuration, if noise on the power supply 15 during power-up of the device causes the trigger circuit 25 to unintentionally turn on the discharge transistor 70, then the delay circuit 30 is effective in slowing down the turn off of the discharge transistor 70. The turn-off of the discharge transistor 70 is delayed by the addition of the resistive element 65. The resistive element 65 serves as a current limiting element and slows down the turn-off of the transistor 70 as the gate node of the transistor 70 is pulled to ground 20. In the case of an actual ESD event, slowing down the turn-off of the discharge transistor 70 does not effect the circuit operation because the duration of the ESD event is short enough that the voltage has already been dissipated by the transistor when the discharge transistor 70 turns-off. In a particular embodiment, the pull-up transistor 60 is a PMOS transistor, the pull-down transistor 55 is an NMOS transistor and the resistive element 65 is a resistor. It is within the scope of the present invention to also use a transistor as the resistive element, and to utilize both PMOS and NMOS configurations with the appropriate supporting circuitry as will be apparent to persons of skill in the art.

Figure 2:
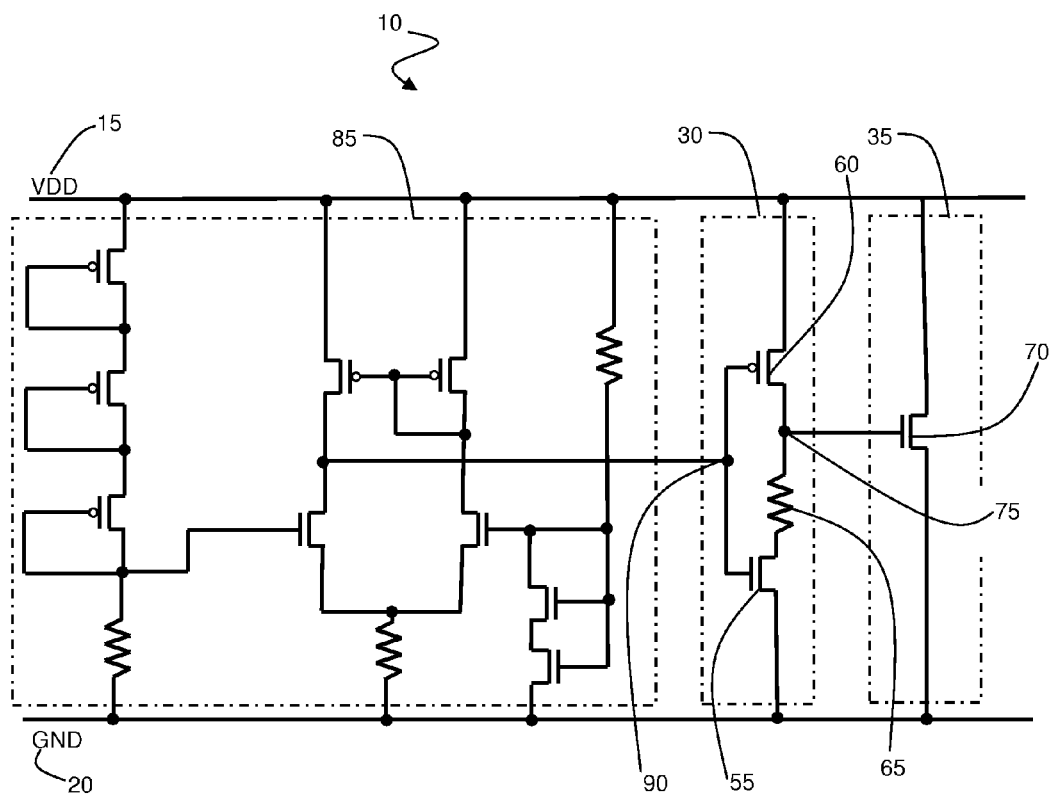
FIG. 2 is a diagrammatic view of an ESD protection circuit in accordance with an embodiment of the present invention employing a level sensing trigger.

With reference to FIG. 2, in an additional embodiment, a voltage level trigger circuit 85 is used instead of the RC trigger circuit 25 to trigger the ESD discharge circuit 35 during an ESD event. In accordance with this embodiment, an ESD event causes a high voltage level on VDD 15 which is sensed by the voltage level sensing trigger circuit 85. In response to the ESD event, the voltage level sensing trigger circuit 85 sets node 90 high, which causes the source of the p-channel transistor 60 to rise quickly. As in the case of the RC triggered circuit of FIG. 1, pull-up transistor 60 pulls the gate node 75 of the discharge transistor 70 high, which turns discharge transistor 70 on and shunts the ESD current to ground to prevent damage to the integrated circuit.

As in the RC trigger circuit, the embodiment illustrated in FIG. 2 includes a delay circuit 30 that is effective in slowing down the turn-off of the discharge circuit to prevent an overshoot or undershoot condition on the power bus when the discharge transistor 70 is unintentionally turned on during a power-up event. With reference again to FIG. 2, in a particular embodiment, the delay circuit 30 includes an inverter having a pull-up transistor 60 and a pull-down transistor 55 and a resistive element 65. The pull-up transistor 60 of the delay circuit 30 has a gate node coupled to the trigger circuit 85, a source node coupled to the power supply 15 and a drain node coupled to the ESD discharge circuit 35. The pull-down transistor 55 of the delay circuit 30 has a gate node coupled to the trigger circuit 25 and a source node coupled to a ground node 20 and the resistive element 65 is then coupled between ESD discharge circuit 35 and a drain node of the pull-down transistor 55. With this configuration, if noise on the power supply 15 during power-up of the device causes the trigger circuit 85 to unintentionally turn on the discharge transistor 70, then the delay circuit 30 is effective in slowing down the turn off of the discharge transistor 70. The turn-off of the discharge transistor 70 is delayed by the addition of the resistive element 65. The resistive element 65 serves as a current limiting element and slows down the turn-off of the transistor 70 as the gate node of the transistor 70 is pulled to ground 20. In the case of an actual ESD event, slowing down the turn-off of the discharge transistor 70 does not effect the circuit operation because the duration of the ESD event is short enough that the voltage has already been dissipated by the transistor when the discharge transistor 70 turns-off. In a particular embodiment, the pull-up transistor 60 is a PMOS transistor, the pull-down transistor 55 is an NMOS transistor and the resistive element 65 is a resistor. It is within the scope of the present invention to also use a transistor as the resistive element, and to utilize both PMOS and NMOS configurations with the appropriate supporting circuitry as will be apparent to persons of skill in the art.

Figure 3:
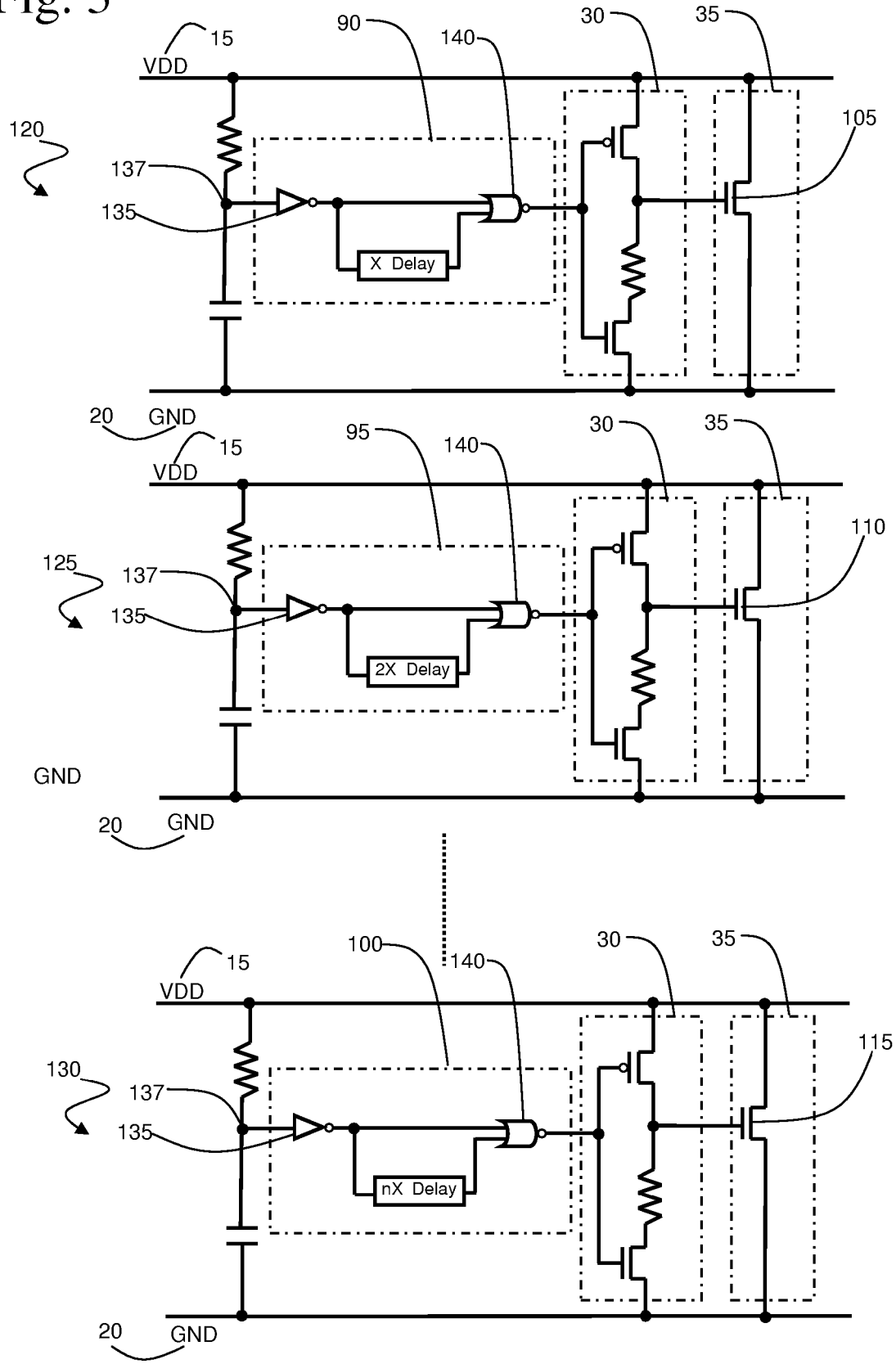
FIG. 3 is a diagrammatic view of a plurality of ESD protection circuits in accordance with an embodiment of the present invention having staggered turn-off delays.

With reference to FIG. 3, an additional embodiment of the present invention is illustrated in which there are a plurality of ESD protection circuits 120, 125, 130 coupled between VDD 15 and GND 20. This configuration is commonly used to provide ESD protection to various circuits of an integrated circuit device. In this configuration, each of the plurality of ESD protection circuits 120, 125, 130 includes a corresponding turn-off delay circuit 90, 95, 100. The turn-off delay circuit 90, 95, 100 is effective in staggering the turn-off signal to the discharge transistors 105, 110, 115 to better control the combined turn-off current between VDD 15 and GND 20, thereby further reducing the overshoot or undershoot voltage protection. As such, the ESD protection circuit 120 includes a turn-off delay circuit 90 which delays the turn-off signal that is transmitted to the discharge transistor 105. Similarly, ESD protection circuit 125 includes a turn-off delay circuit 95 which delays the turn-off signal that is transmitted to the discharge transistor 110 and ESD protection circuit 130 includes a turn-off delay circuit 100 which delays the turn-off signal that is transmitted to the discharge transistor 115. As illustrated, additional ESD protection circuits may be included a necessary for the overall protection of the integrated circuit device. Each of the turn-off delay circuits includes circuitry that delays the turn-off signal to the respective discharge transistor for a specific duration of time. As such, the turn-off delay circuit 90 may be result in a shorter delay than the turn-off delay circuit 95, which may result in a shorter delay than the turn-off delay circuit 100. Accordingly, the turn-off delays for the plurality of ESD protection circuits are staggered. The staggering of the turn-off delay allows for better control of the total turn-off current for the plurality of ESD protection circuits which increases the overshoot and undershoot protection of the device. In a particular embodiment, the circuitry to provide the turn-off delay may include at least one inverter 135 and at least one NOR gate 140 coupled between a triggering input 137 to the turn-off delay circuit and the delay circuit. The inverter 135 and the NOR gate 140 to delay the transmission of the turn-off signal to the delay circuit 90 but not to delay the transmission of the turn-on signal to the delay circuit 90.

Figure 4:
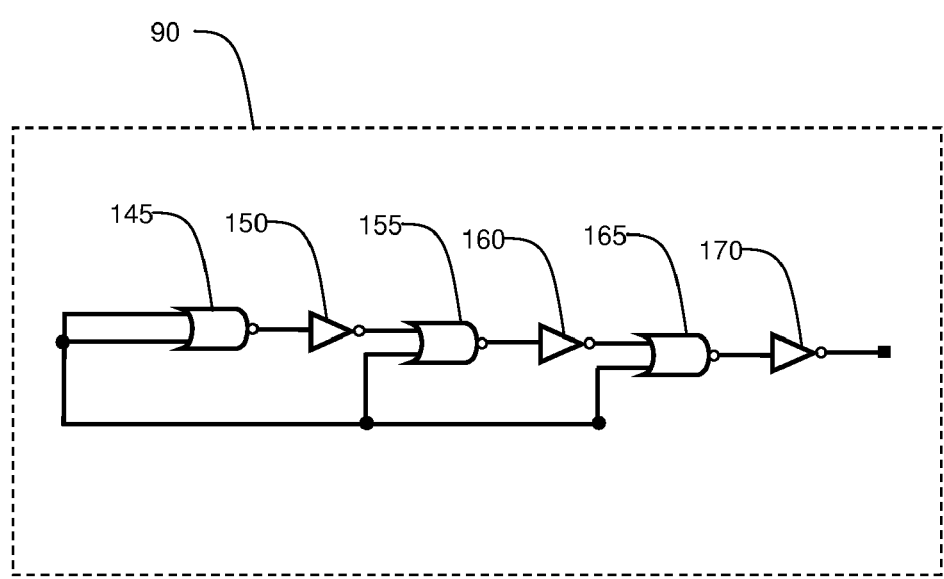
FIG. 4 is a diagrammatic view of a turn-off delay for use in an ESD protection circuit in accordance with an embodiment of the present invention.

As shown with reference to FIG. 4, the turn-off delay circuit may include a plurality of inverters and NOR gates configured as shown. By using the NOR gates in combination with the inverters, the input to the discharge transistor is only delayed on the falling edge, when the gate to the discharge transistor changes from high to low, and not on the rising edge. In the particular embodiment illustrated with reference to FIG. 4, a turn-off delay circuit such as the turn-off delay circuit 90 of FIG. 3, includes a first NOR gate 145 having its inputs coupled together and its output coupled to a first inverter 150. One input of a second NOR gate 155 is then coupled to the output of the first inverter 150 and the second input of the second NOR gate 155 is coupled to the inputs of the first NOR gate 145. The output of the second NOR gate 155 is coupled to a second inverter 160. The output of the second inverter 160 is coupled to one input of a third NOR gate 165 and the second input of the third NOR gate 165 is coupled to the inputs of the first NOR gate 145. The output of the third NOR gate 165 is coupled to a third inverter 170 and the output of the third inverter 170 is coupled a fourth NOR gate 170, which then drives the delay circuit 30 as previously described. Varying numbers of inverters and NOR gates are then used in the different ESD protection circuits of the integrated circuit to establish a staggered turn-off delay among the ESD protection circuits. The more inverters and NOR gates that are included, the more delay will be introduced into the circuit.

Although specific embodiments of the invention have been disclosed, it will be understood by those having ordinary skill in the art that changes can be made to the specific embodiments without departing from the spirit and scope of the invention. Additionally, many modifications may be made to adapt a particular situation to the teachings of the present invention without departing from the central inventive concepts described herein. Furthermore, an embodiment of the present invention may not include all of the features described above. The scope of the invention is not to be restricted, therefore, to the specific embodiments, and it is intended that the appended claims cover any and all such applications, modifications, and embodiments within the scope of the present invention.

What is claimed is:

1. An electrostatic discharge (ESD) protection circuit for an integrated circuit device having overshoot and undershoot voltage protection during a power supply ramp-up of the integrated circuit device, the ESD protection circuit comprising a plurality of individual ESD protection circuits and each of the individual ESD protection circuits comprising:
   an ESD discharge circuit coupled between a power supply node and a ground supply node;
   a trigger circuit coupled to the ESD discharge circuit, the trigger circuit to transmit a turn-on signal to the ESD discharge circuit in the presence of a voltage spike during the power supply ramp-up and to transmit a turn-off signal to the ESD discharge circuit in the absence of a voltage spike during the power supply ramp-up;
   a delay circuit coupled between the ESD discharge circuit and the trigger circuit, the delay circuit to slow down the turn-off of the ESD discharge circuit to prevent an overshoot or undershoot voltage condition during the power supply ramp-up of the integrated circuit device; and
   a turn-off delay circuit coupled to the trigger circuit to establish a delay time for the transmission of the turn-off signal and wherein the delay time is different for each of the plurality of individual ESD protection circuits such that the turn-off signal transmission for each of the plurality of individual ESD protection circuits is staggered.

2. The ESD protection circuit of claim 1, wherein the ESD discharge circuit is a MOSFET transistor and the gate of the MOSFET transistor is coupled to the delay circuit.

3. The ESD protection circuit of claim 1, wherein the trigger circuit further comprises a drive circuit to actively drive the ESD discharge circuit.

4. The ESD protection circuit of claim 3, where the drive circuit comprises at least one CMOS inverter.

5. The ESD protection circuit of claim 1, wherein the trigger circuit is an RC trigger circuit.

6. The ESD protection circuit of claim 1, wherein the trigger circuit is a voltage level sensing trigger circuit.

7. The ESD protection circuit of claim 1, wherein the delay circuit further comprises an inverter having a pull-up transistor and a pull-down transistor and a resistive element positioned between an output of the inverter and a drain node of the pull-down transistor.

8. The ESD protection circuit of claim 1, wherein the delay circuit further comprises:
   a pull-up transistor having a gate node coupled to the trigger circuit, a source node coupled to the power supply node and a drain node coupled to the ESD discharge circuit;
   a pull-down transistor having a gate node coupled to the trigger circuit and a source node coupled to a ground node; and
   a resistive element coupled between the ESD discharge circuit and a drain node of the pull-down transistor.

9. The ESD protection circuit of claim 8, wherein the pull-up transistor is a PMOS transistor.

10. The ESD protection circuit of claim 8, wherein the pull-down transistor is an NMOS transistor.

11. The ESD protection circuit of claim 8, wherein the resistive element is a resistor.

12. The ESD protection circuit of claim 8, wherein the resistive element is a transistor.

13. The ESD protection circuit of claim 1, wherein the turn-off delay circuit further comprises at least one inverter and at least one NOR gate coupled between a triggering input to the turn-off delay circuit and the delay circuit, the at least one inverter and the at least one NOR gate to delay the transmission of the turn-off signal to the delay circuit but not to delay the transmission of the turn-on signal to the delay circuit.

14. An electrostatic discharge (ESD) protection circuit for an integrated circuit device, the ESD protection circuit comprising a plurality of individual ESD protection circuits and each of the individual ESD protection circuits comprising:
   a first NMOS transistor having a drain node coupled to a power supply node and a source node coupled to a ground supply node;
   a trigger circuit coupled to a gate node of the first NMOS transistor, the trigger circuit to transmit a turn-on signal to the first NMOS transistor in the presence of a voltage spike during the power supply ramp-up and to transmit a turn-off signal to the first NMOS transistor in the absence of a voltage spike during the power supply ramp-up;

a delay circuit comprising a PMOS transistor having a source node coupled to the power supply node, a drain node coupled to the gate node of the first NMOS transistor and a gate node coupled to the gate node of a second NMOS transistor, a source node of the second NMOS transistor coupled to the ground supply node, a resistive element coupled between a drain node of the second NMOS transistor and the gate node of the first NMOS transistor; and a turn-off delay circuit coupled to the trigger circuit to establish a delay time for the transmission of the turn-off signal and wherein the delay time is different for each of the plurality of individual ESD protection circuits such that the turn-off signal transmission for each of the plurality of individual ESD protection circuits is staggered.

15. The ESD protection circuit of claim 14, wherein the trigger circuit is an RC trigger circuit.

16. The ESD protection circuit of claim 14, wherein the trigger circuit is a voltage level sensing trigger circuit.

17. The ESD protection circuit of claim 14, wherein the resistive element is a resistor.

18. The ESD protection circuit of claim 14, wherein the resistive element is a transistor.

19. A method for preventing damage to an electrostatic discharge (ESD) protection circuit of an integrated circuit device when the ESD circuit is unintentionally turned-on during power-up of the ESD protection circuit, the ESD protection circuit comprising a plurality of individual ESD protection circuits and each of the individual ESD protection circuits comprising an ESD discharge circuit, the method comprising the step of:

delaying the turn-off of the ESD discharge circuit to prevent an overshoot or undershoot voltage condition thereby preventing damage to the ESD protection circuit; and delaying the transmission of a turn-off signal to the ESD discharge circuit for each of the plurality of ESD protection circuits such that the turn-off of each of the plurality of ESD discharge circuits is staggered.

20. The method of claim 19, wherein the unintentional turn-on of the ESD discharge circuit is a result of noise on a power supply bus coupled to the ESD protection circuit.

* * * * *

UNITED STATES PATENT AND TRADEMARK OFFICE
CERTIFICATE OF CORRECTION

PATENT NO. : 7,706,113 B1  
APPLICATION NO. : 11/668360  
DATED : April 27, 2010  
INVENTOR(S) : Chuen-Der Lien and Ta-Ke Tien Page 1 of 1

It is certified that error appears in the above-identified patent and that said Letters Patent is hereby corrected as shown below:

Column 10, Line 10, Claim 19, "comprising the step of:" should read --comprising:--

Signed and Sealed this
Twenty-eighth Day of February, 2012

David J. Kappos
*Director of the United States Patent and Trademark Office*